(12) United States Patent
Coban et al.

(10) Patent No.: US 10,931,300 B1
(45) Date of Patent: Feb. 23, 2021

(54) LOW-POWER PROGRAMMABLE BANDWIDTH CONTINUOUS-TIME DELTA SIGMA MODULATOR BASED ANALOG TO DIGITAL CONVERTER

(71) Applicant: Silicon Laboratories Inc., Austin, TX (US)

(72) Inventors: Abdulkerim L. Coban, Austin, TX (US); Sanjeev Suresh, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/588,113

(22) Filed: Sep. 30, 2019

(51) Int. Cl.
*H03M 3/00* (2006.01)
*H03F 3/45* (2006.01)
*H04B 1/00* (2006.01)

(52) U.S. Cl.
CPC ........ *H03M 3/392* (2013.01); *H03F 3/45475* (2013.01); *H03M 3/322* (2013.01); *H03M 3/438* (2013.01); *H03M 3/458* (2013.01); *H03M 3/498* (2013.01); *H04B 1/0007* (2013.01)

(58) Field of Classification Search
CPC ...... H03M 3/392; H03M 3/322; H03M 3/438; H03M 3/458; H03M 3/498
USPC ............................ 341/118–155; 327/115, 117
See application file for complete search history.

(56) References Cited

U.S. PATENT DOCUMENTS

| | | | | |
|---|---|---|---|---|
| 7,405,601 | B2 * | 7/2008 | Garlapati | H03K 23/66 327/115 |
| 8,139,281 | B1 * | 3/2012 | Wang | G02F 1/0123 250/200 |
| 8,749,417 | B2 | 6/2014 | Coban et al. | |
| 10,025,042 | B2 * | 7/2018 | Isenhour | G02B 6/423 |
| 2005/0242848 | A1 * | 11/2005 | Sun | H03L 7/193 327/115 |

(Continued)

OTHER PUBLICATIONS

Chae, H., et al., "A 12 mW Low Power Continuous-Time Bandpass ΔΣ Modulator With 58 dB SNDR and 24 MHz Bandwidth at 200 MHz IF," IEEE Journal of Solid-State Circuits, vol. 49, No. 2, Feb. 2014, pp. 405-415.

(Continued)

*Primary Examiner* — Lam T Mai
(74) *Attorney, Agent, or Firm* — Zagorin Cave LLP

(57) ABSTRACT

A continuous-time (CT) delta-sigma modulator (DSM) based analog to digital converter (ADC) in a radio receive chain supports a wide range of data rates in a power efficient way in a small die area. The ADC utilizes a $2^{nd}$ order loop-filter with a single-amplifier loop-filter topology using a two stage Miller amplifier with a feed forward path and a push-pull output stage. High bandwidth operations utilize a "negative-R" compensation scheme at the amplifier input. Negative-R assistance is disabled for low data rate applications. With the negative-R assistance disabled, loop-filter resistor values are increased, instead of only the loop filter capacitor values to scale the noise transfer function (NTF), thereby limiting the capacitor area needed and enabling lower power operation. The NTF zero location is programmable allowing the NTF zero to be located near the intermediate frequency for different bandwidths to reduce the DSM quantization noise contribution for narrow-band (low data rate) applications.

21 Claims, 7 Drawing Sheets

(56) References Cited

U.S. PATENT DOCUMENTS

2007/0152756 A1* 7/2007 Li .......................... H03F 3/08
                                                  330/308

OTHER PUBLICATIONS

Jang, M., et al., "Analysis and Design of Low-Power Continuous-Time Delta-Sigma Modulator Using Negative-R Assisted Integrator," IEEE Journal of Solid-State Circuits, vol. 54, No. 1, Jan. 2019, pp. 277-287.

* cited by examiner

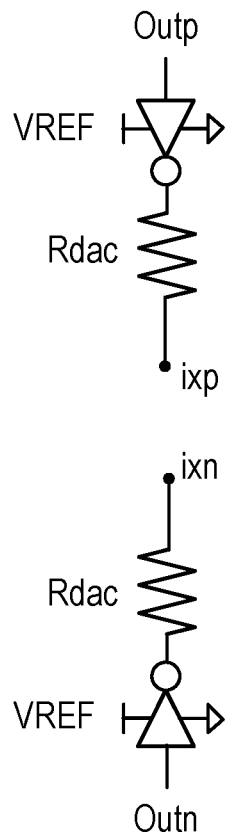
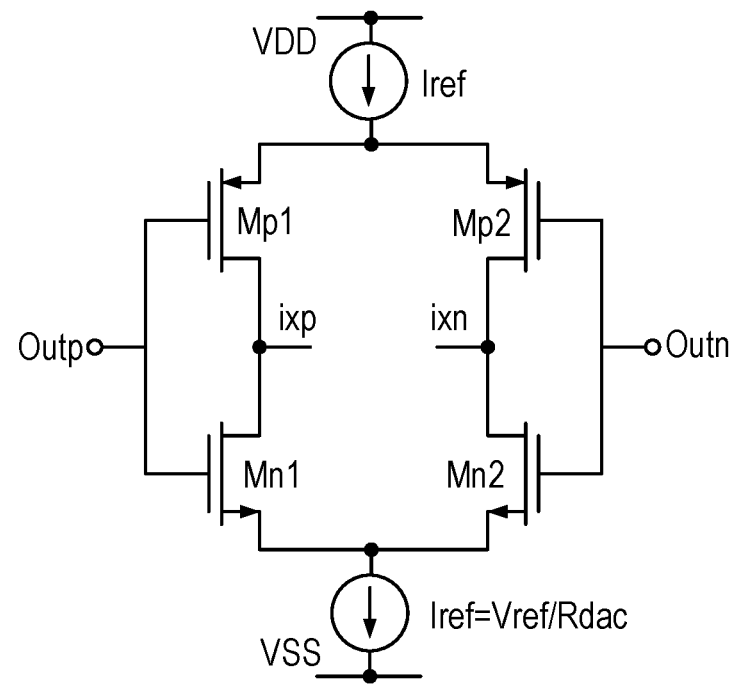
Fig. 9
Fig. 10
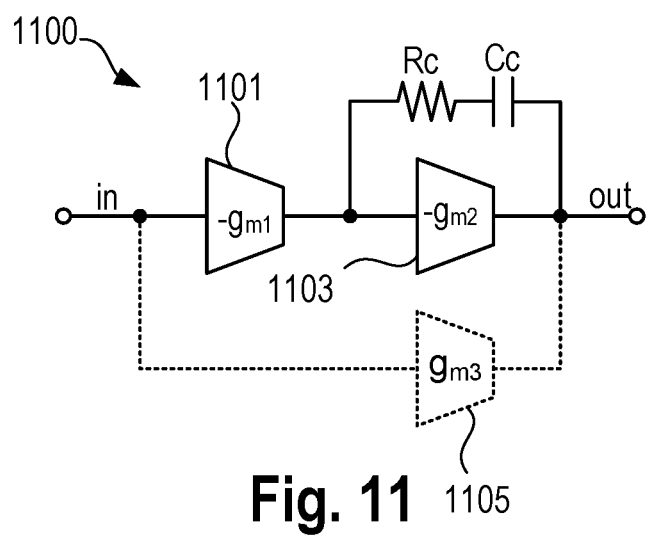
Fig. 11

LOW-POWER PROGRAMMABLE BANDWIDTH CONTINUOUS-TIME DELTA SIGMA MODULATOR BASED ANALOG TO DIGITAL CONVERTER

BACKGROUND

Field of the Invention

This disclosure relates analog to digital converters.

Description of the Related Art

Analog to digital converters can be found in a wide range of applications including in a receive chain of a radio receiver. There are many different radio standards such as Bluetooth™ Low Energy, Zigbee™ and other proprietary standards. Data rates for these standards vary from sub kilobits per second (kpbs) to a few megabits per second (Mbps), e.g., 100 bps to 3 Mbps. Providing a receive chain analog to digital converter that can support these various data rates in a power efficient and size efficient way would be desirable.

SUMMARY OF EMBODIMENTS OF THE INVENTION

Accordingly, in an embodiment, a method includes configuring an analog to digital converter (ADC) to operate at either a first data rate or a second data rate, the second data rate being lower than the first data rate. For operating the ADC at the first data rate, a negative-R compensation circuit at inputs to an amplifier of a delta sigma modulator is enabled. For operating the ADC at a second data rate, the negative-R compensation circuit is disabled.

In another embodiment, an analog to digital converter (ADC) is provided that includes a delta sigma modulator and a negative-R compensation circuit coupled to one or more switches, the one or more switches responsive to a first value of a control signal to enable the negative-R compensation circuit to be coupled to input terminals of an amplifier of the delta sigma modulator and responsive to a second value of the control signal to disable the negative-R compensation circuit.

In another embodiment an analog to digital converter (ADC) includes a delta sigma modulator and negative-R compensation circuit selectively enabled to provide a loop gain enhancement to an amplifier of the delta sigma modulator and configurable to be enabled for a first data rate for data being supplied to the delta sigma modulator and to be disabled for a second data rate for data being supplied to the delta sigma modulator, the second data rate being lower than the first data rate.

BRIEF DESCRIPTION OF THE DRAWINGS

The present invention may be better understood, and its numerous objects, features, and advantages made apparent to those skilled in the art by referencing the accompanying drawings.

FIG. 9 illustrates a resistive DAC for use in the DSM.

FIG. 10 illustrates a current steering DAC that may be used in the DSM.

FIG. 11 illustrates a high-level block diagram of a two-stage Miller amplifier with an additional feedforward path.

The use of the same reference symbols in different drawings indicates similar or identical items.

DETAILED DESCRIPTION

Figure 1:
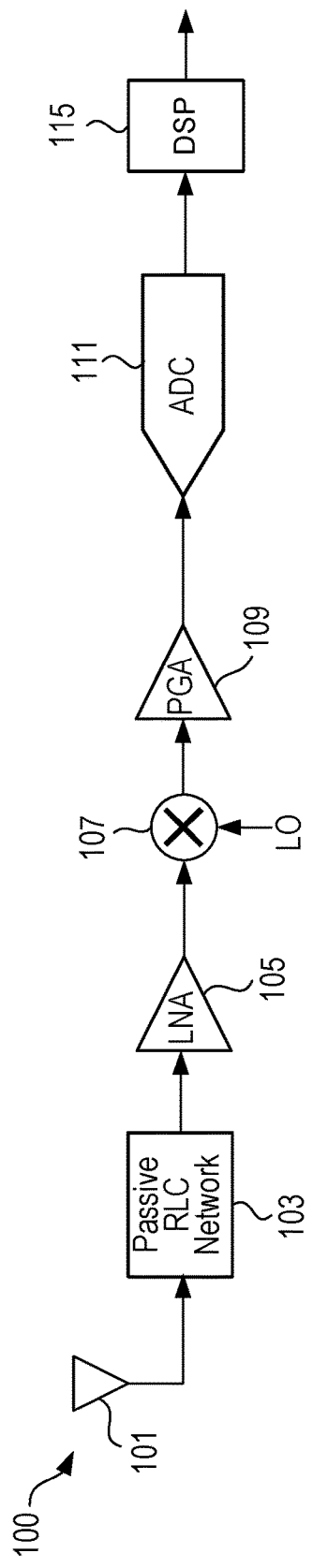
FIG. 1 illustrates a high level block diagram of a radio receive chain.

FIG. 1 illustrates a high level block diagram of a receive (RX) chain 100 in a radio in which embodiments of the invention can be utilized. The receive chain includes an antenna 101, a passive network 103, typically implemented as an RLC network, a low noise amplifier 105, a mixer 107 that supplies analog data at the intermediate frequency (IF) to a programmable gain amplifier (PGA) 109. In addition to gain programmability, the PGA, typically, incorporates filtering to attenuate undesired blocker signals. The amplifier 109 supplies the analog input signal to the analog to digital converter (ADC) 111, which in turn supplies digital signals to digital signal processor 115 for processing of the received radio signal. Embodiments described herein utilize a low power and small die area RX ADC that is suitable for a wide range of data rates, e.g., from less than 1 kilobit per second (kbps) up to 3 megabits per second (Mbps), without incurring significant area and power overhead to handle the wide range of data rates. That allows a single RX ADC to support various standards such as Bluetooth™ Lower Energy (BLE), Zigbee™, and sub-GHz bands used in proprietary standards for various Internet of Things (IoT) applications.

Figure 2:
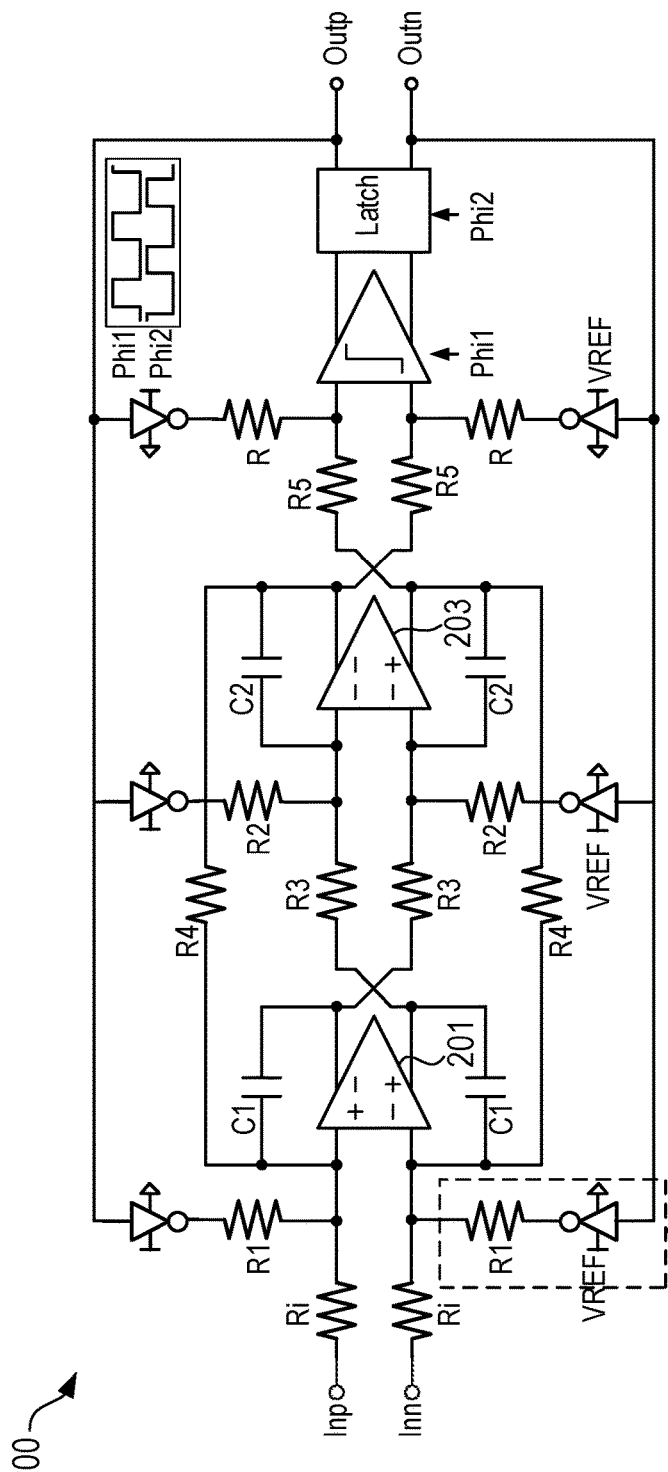
FIG. 2 illustrates a prior art $2^{nd}$ order (with two integrators) delta sigma modulator suitable for use in a receive chain ADC.

A typical RX ADC utilizes a delta sigma modulator based analog to digital converter. FIG. 2 illustrates a prior art $2^{nd}$ order (with two integrators) delta sigma modulator 200 suitable for use in a RX ADC. The DSM 200 includes two amplifiers 201 and 203 configured in a distributed feedback topology. The DSM 200 utilizes resistive DACs such as resistive DAC 205.

Figure 3:
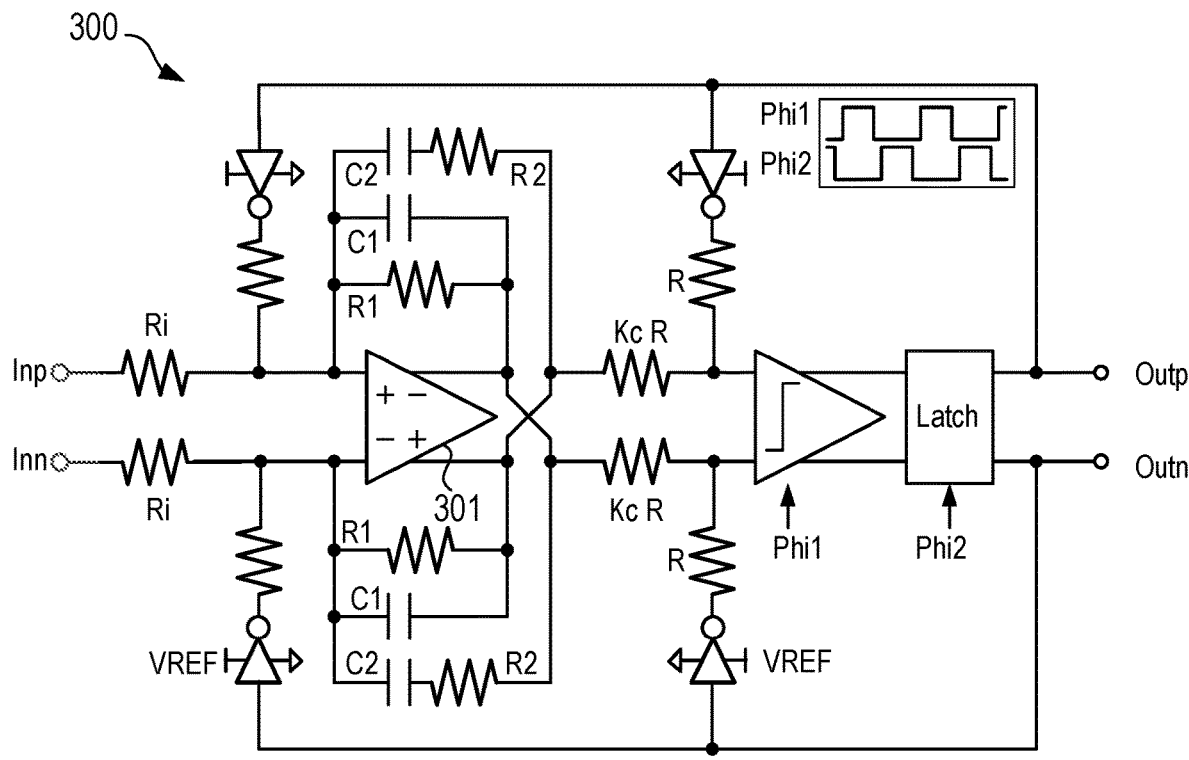
FIG. 3 illustrates an embodiment of a $2^{nd}$ order continuous-time (CT) delta-sigma modulator (DSM) based ADC with only a single amplifier.

FIG. 3 illustrates an embodiment of a $2^{nd}$ order continuous-time (CT) delta-sigma modulator (DSM) based ADC 300 that helps provide a more power and space efficient ADC. The ADC 300 implements a second order loop filter with only a single amplifier 301 to save area and power and implements the same signal and noise transfer functions as the two amplifier topology of the $2^{nd}$ order DSM based ADC 200 shown in FIG. 2. As the operation of a delta sigma modulator based ADC is well understood, the conventional details of the operation of the DSM based ADC 300 are being omitted.

Figure 4:
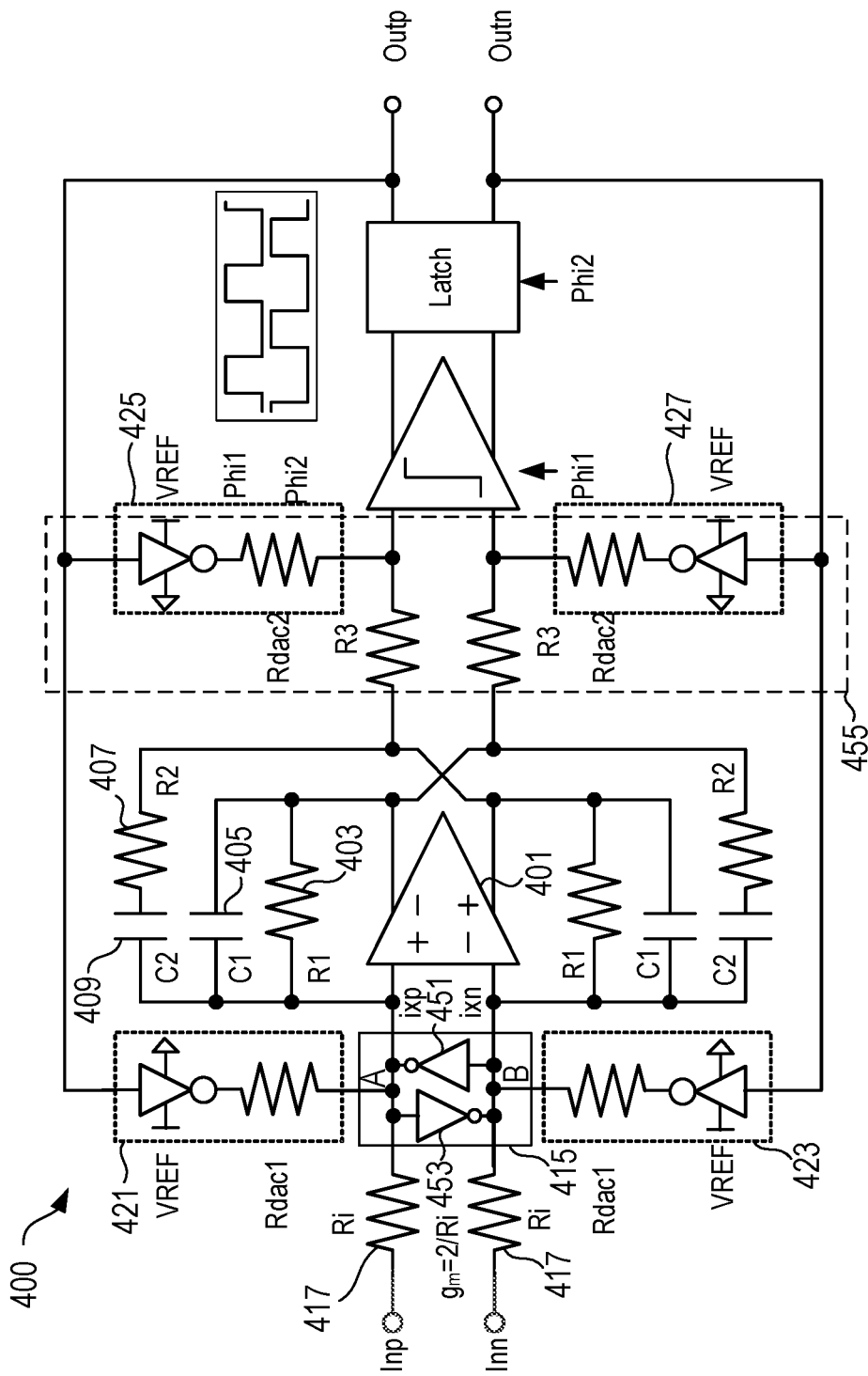
FIG. 4 illustrates an embodiment of a $2^{nd}$ order continuous-time (CT) delta-sigma modulator (DSM) based ADC with only a single amplifier that provides a loop gain enhancement at the amplifier input with negative-R assistance.

FIG. 4 illustrates another embodiment of a $2^{nd}$ order continuous-time (CT) delta-sigma modulator (DSM) based ADC 400 that provides a more power and space efficient ADC as compared to ADC 200. Similar to ADC 300, the ADC 400 implements a second order loop filter with only a single amplifier 401 to save area and power. The ADC implements the functions of the first and the second integrators of DSM 200 using amplifier 401, resistor R1 403, resistor R2 407, capacitor C1 405, and capacitor C2 409. As the implementation of the DSM based ADC 400 is differential, similar capacitors and resistors are found coupled between the positive output of amplifier 401 and the negative input of amplifier 401. DSM based ADC 400 has the same signal and noise transfer functions as the two amplifier topology of the $2^{nd}$ order DSM based ADC 200 shown in FIG. 2.

The DSM based ADC 400 provides a loop gain enhancement at the amplifier input using negative-R assistance circuit 415. The negative-R circuitry is essentially an active impedance synthesizing circuit whose output impedance, in a small-signal sense, is resistive with a negative polarity. In FIG. 4, the negative-R assistance circuit 415 is implemented using CMOS amplifiers shown as inverters 451 and 453. The inputs and outputs of inverters 451 and 453 are connected to the low signal-swing input virtual ground nodes (ixp and ixn) of the amplifier 401. The output impedance of the inverters is nominally set to the negative of the resistance of the parallel combination of input resistor Ri, 417 and the feedback DAC resistor Rdac1, 421 (-Ri//Rdac1). In an embodiment, the negative-R circuit 415 is disabled when the clock rate (fs) (represented by Ph1 and Ph2 in FIG. 4) is reduced since at low frequencies, the loop gain is already high and negative-R assistance is not needed. By disabling the negative-R assist circuit the overall thermal noise floor is lowered. That allows the use of larger resistors with no overall thermal noise penalty, as the increased thermal noise of the larger resistors is offset by the elimination of negative-R noise contribution. Or in other words, the larger resistors add noise but there is noise budget available with the negative-R circuit disabled. As described further herein, using larger resistors helps keep the loop filter area in the ADC low by limiting the capacitor increase to, e.g., 4×, for 8×NTF scaling while keeping the thermal noise level substantially constant as explained further herein. Larger resistors also allow the use of lower current amplifiers thereby reducing overall power dissipation.

Figure 5:
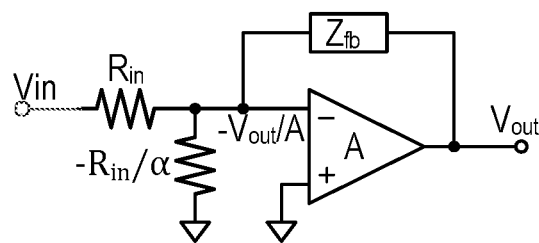
FIG. 5 illustrates conceptually the improvement in effective gain using the negative-R assist circuit.
Figure 6:
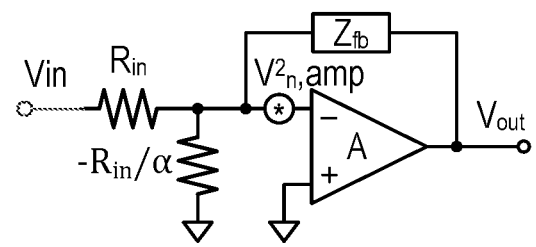
FIG. 6 illustrates conceptually the thermal noise impact of using the negative-R assist circuit.

FIGS. 5 and 6 illustrate conceptually the advantages (and disadvantages) of the negative-R assist circuit for a single-ended amplifier embodiment. It is assumed that the amplifier has a finite gain of A(s). In FIGS. 5 and 6 $\alpha=1$ nominally (implying negative-R value is set to $-Ri//Rdac1$) and $|Z_{fb}/R_{in}| \gg 1$, where $Z_{fb}$ is the feedback network impedance. The gain is shown as $$\frac{V_{out}}{V_{in}} = -\frac{Z_{fb}}{R_{in}} \frac{1}{1 + \frac{1}{A(s)} + (1-\alpha)\frac{Z_{fb}/R_{in}}{A(s)}}.$$

With $\alpha=1$, the second term $$\frac{Z_{fb}/R_{in}}{A(s)}$$

disappears thereby improving the effective gain of the amplifier. Non-linearity induced distortion of the operational amplifier is reduced. Noise of the operational amplifier is attenuated at the expense of negative-R circuit noise. With reference to FIG. 6, the input referred noise power density $v_{n,in}^2$ can be calculated as:

$$v_{n,in}^2 = 4kTR_{in}(1+\alpha) + \left(1 - \alpha + \frac{R_{in}}{Z_{fb}}\right)^2 v_{n,AMP}^2 + v_{n,in,Z_{fb}}^2,$$

where k is Boltzmann's constant, T is temperature in Kelvin, and $R_{in}$ is the input resistance, and thus the thermal noise contribution ($4kTR_{in}(1+\alpha)$) approximately doubles with $\alpha=1$. Note in the above equation $v_{n,AMP}^2$ and $v_{n,in,Z_{fb}}^2$ represent noise power densities of the amplifier input referred noise and feedback network, respectively.

The transfer function of the $2^{nd}$ order loop-filter with a single operational amplifier as shown in FIG. 4 is:

$$H(s) = \frac{R_1}{R_i} \frac{1 + sR_2C_2}{1 + s(R_1C_1 + R_2C_2 - R_1C_2) + s^2R_1R_2C_1C_2}, \quad (1)$$

and with the constraint that $R_1C_1 + R_2C_2 = R_1C_2$ the above equation can be put in the form $$H(s) = \frac{R_1}{R_i} \frac{1 + sR_2C_2}{1 + s^2R_1R_2C_1C_2} \quad (2)$$

which has the same form of the loop filter transfer function of the two-integrator loop filter depicted in FIG. 2. Note that the loop filter component values are not identical in the implementations of ADC 200 and ADC 400.

For lower data rates the delta sigma modulator noise transfer function (NTF) scales proportionately to the data-rate at discrete steps (e.g., 8 steps to cover the data rates). NTF scaling is normally done through capacitor scaling in order to keep the thermal noise floor unaffected (i.e., if sampling frequency is scaled down by a factor K, the capacitor values are scaled up by a factor of K). That approach naturally leads to large capacitor areas being needed for low-frequency operation. In embodiments herein, NTF scaling is done through scaling of clock frequency as well as scaling input resistor and capacitor values of the DSM loop filter. In embodiments, ADC loop-filter capacitor and input resistance values are chosen such that at high-frequency operation (high data-rate, high bandwidth (BW)), when the negative-R circuit 415 is present, the thermal noise floor specifications are met. When the sampling frequency is low, there is no need for the negative-R assistance and the negative-R assist circuit is turned off and the thermal contribution from the negative-R assistance circuit disappears. Therefore, if the input resistor values remain unscaled with the negative-R assist circuit turned off, the thermal floor drops (lower thermal noise density). That is true even if the operational amplifier noise contribution is increased as the operational amplifier is designed such that its noise contribution is low compared to loop filter resistors.

Embodiments increase the loop filter resistor values (Ri, R1, R2, Rdac1), instead of just the loop filter capacitor values when the negative-R circuit is disabled. In particular, the resistance of input resistors Ri 417 is increased and rest of the loop filter resistor values (R1 403, R2 407, and Rdac1) are scaled with the same scaling factor as Ri when the negative-R circuit is disabled. That allows the capacitors in the loop filter (C1, C2) to be increased by a lesser amount (scaled down by the resistor scaling factor) thereby requiring less area for capacitor scaling. The increased resistance increases the thermal noise but not above the thermal noise floor for the high data rate applications. Also, operational amplifier current requirements can be relaxed. Of course, if a lower thermal noise floor at low data rates is desired, then NTF scaling can be done by scaling only the capacitance of the loop filter (while keeping the negative-R circuit disabled) if sufficient die area has been allocated to the loop filter capacitance for scaling. In general, the negative-R circuit does not have to be either on with a magnitude of the negative-resistance value equal to the effective input impedance (−Ri//Rdac1 i.e., $\alpha$=1) or totally disabled. Note that due to inherent variability in circuits, the negative-resistance value is approximately equal to the effective input impedance. In embodiments the negative-resistance value is set to some middle level, (e.g., $\alpha$=0.5 (−2×Ri//Rdac1) for medium data rate applications when the sampling clock frequency (and corresponding data rate) chosen are not at maximum or close to maximum levels. Thus, in embodiments, the negative-R compensation circuit is operated at an intermediate compensation level between full compensation and no compensation for intermediate data rates between the maximum data rate and the data rates at which the negative-R compensation is disabled.

In addition to enabling/disabling the negative-R assist and NTF scaling, embodiments herein provide for programming the NTF zero location thereby allowing the NTF zero to be located near the intermediate frequency for different bandwidths. Doing so reduces DSM quantization noise contribution significantly particularly for narrow-band (low data rate applications). For example, at a maximum data rate (2 Mbps in one application) the sample clock frequency is around 320 MHz and the IF bandwidth is about 2.5 MHz making the over sampling rate (OSR) equal to 64. The $$OSR = \frac{fs}{2 \times BW}.$$

For that application the intermediate frequency (IF) is located around 1.5 MHz and the NTF zero is around 1.6 MHz. For lower data rates, the bandwidth can be, e.g., 1.25 MHz with the bandwidth being centered around the IF of 0.75 MHz. Thus, the NTF zero can be programmed from 1.6 MHz to 0.75 MHz to coincide with the lower IF for the smaller bandwidth.

In embodiments, the loop filter components (R1, C1, R2, C2), the input resistors Ri, and the sampling clock frequency (fs) are all programmable. As explained more fully herein, the various components can be programmed for NTF scaling, for programming the NTF zero location, and enabling/disabling the negative-R assist circuit. Table 1 illustrates examples of programming sampling frequency, filter component values, and input resistance for NTF scaling and programming the NTF zero location. In particular, Table 1 shows the scaling of baseline (mode 1) resistors, capacitors, sampling frequency, OSR, and BW for various modes of operation. In an embodiment, in mode 1, the input resistance Ri=80 KOhms, loop filter components R1=5.4 MOhms, R2=50 KOhms, C1=C2=200 fF, and the sampling frequency fs=320 MHz. The OSR=64 and the BW is 2500 kHz. Thus, for a sampling clock frequency of 40 MHz, the bandwidth is 156.25 kHz or 312.5 kHz (modes 6 and 5), for a sampling clock frequency of 160 MHz, the bandwidth is 625 kHz or 1.25 MHz (modes 4 and 2), and for a sampling clock frequency of 320 MHz, the bandwidth is 1.25 MHz or 2.5 MHz (modes 3 and 1).

In modes 1 through 4, the negative-R circuit is enabled and in modes 5 and 6, the negative-R circuit is disabled. When the sampling frequency is halved in mode 2, the capacitors C1 and C2 are doubled to scale NTF accordingly while keeping the thermal noise floor the same. The bandwidth is also halved in mode 2.

In mode 3, the sampling rate fs is kept at its maximum level and R1 is increased by 4 in order to move the NTF zero to a 2× lower frequency for applications with lower data rates (the bandwidth is decreased by a factor of 2). The decrease in bandwidth results in the OSR doubling. The increase in R1 moves the zero location to a lower frequency. That allows the zero to be located at a frequency appropriate for the bandwidth to reduce DSM quantization noise.

TABLE 1

| ADC configurations - Normalized loop parameters | | | | | | | | |
|---|---|---|---|---|---|---|---|---|
| | neg-R | scaling factor | | | | | | |
| mode | assist | ×Ri | ×R1 | ×R2 | ×C1 | ×C2 | ×fs | ×OSR | ×BW |
| 1 | Enabled | 1 | 1 | 1 | 1 | 1 | 1 | 1 | 1 |
| 2 | Enabled | 1 | 1 | 1 | 2 | 2 | ½ | 1 | ½ |
| 3 | Enabled | 1 | 4 | 1 | 1 | 1 | 1 | 2 | ½ |
| 4 | Enabled | 1 | 4 | 1 | 2 | 2 | ½ | 2 | ¼ |
| 5 | Disabled | 2 | 2 | 2 | 4 | 4 | ⅛ | 1 | ⅛ |
| 6 | Disabled | 2 | 8 | 2 | 4 | 4 | ⅛ | 2 | 1/16 | note
R1 can be disconnected to move NTF in-band zero to DC (another mode)

Figure 7:
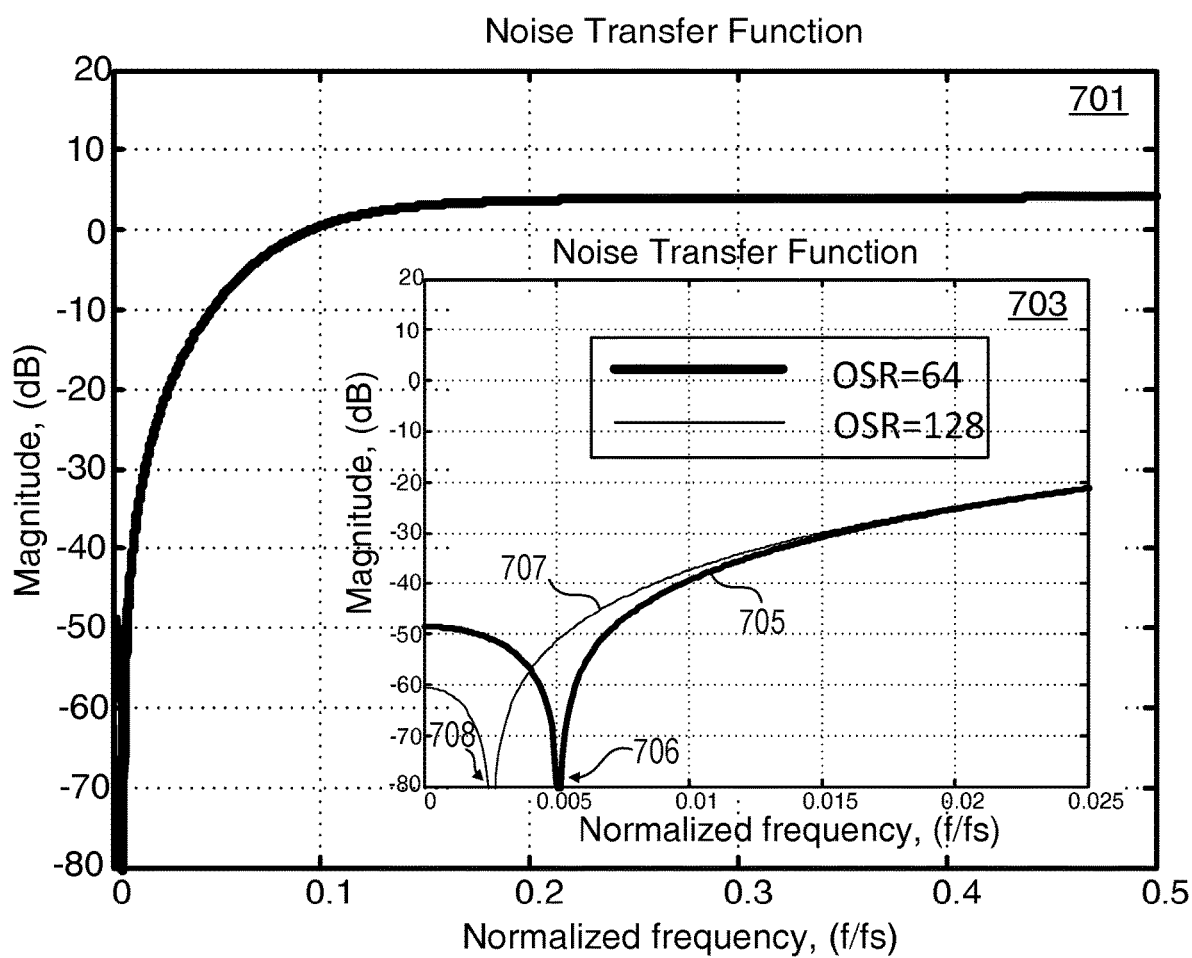
FIG. 7 illustrates noise transfer functions and location of zeros associated with noise transfer functions for different bandwidth configurations of the ADC.

Referring to FIG. 7, the overall noise transfer function is shown in the larger graph 701 and a detail of lower frequencies showing NTF zero locations is shown in the graph insert 703. The NTF zero location can be adjusted depending on the RX Intermediate Frequency (IF) location and signal bandwidth with the assumption that the bandwidth is centered around the IF. In FIG. 7, fs is the ADC sampling frequency. Curve 705 represents the NTF of the ADC configured to have an OSR=64 (e.g., mode 1) and a zero location at 706. The zero location can be shifted for an NTF with a different bandwidth as shown by curve 707 with a zero location at 708. As can be seen, the zero location can be shifted lower implying a higher OSR (smaller bandwidth given the same sampling frequency) such as mode 3 in Table 1. Configuring R1 (see Table 1 and FIG. 4) to a higher resistance can be used to move the zero location to a more desired location given the bandwidth and IF. Note that curve 705 corresponds to modes 1, 2, and 5 of Table 1 whereas curve 707 corresponds to modes 3, 4, and 6. Referring again to Table 1, in mode 4 with the sampling frequency halved, C1 and C2 are doubled to maintain the same frequency normalized NTF shape and to keep the same thermal noise floor. R1 is increased by 4× to move the zero to one-half the original zero frequency to better match the NTF zero location with the IF of the smaller bandwidth. In mode 4, the bandwidth is reduced by 4 or equivalently the OSR doubled.

Mode 5 is the first mode with the negative-R assist circuit disabled due to the lower data rate (sampling frequency ⅛ of the mode 1 sampling frequency). In order to limit the scaling of the capacitors C1 and C2, the resistance values of the input resistors Ri, feedback DAC resistor Rdac1, and feedback network resistors R1 and R2 are doubled. Doubling the loop-filter resistors (Ri, R1, R2, and Rdac1) allows scaling of C1 and C2 to be limited to 4× to scale down the NTF by 8× and to keep the thermal noise floor substantially constant. Doubling all the resistor values (Ri, Rdac1, R1, R2) at the same time preserves the frequency normalized NTF shape intact. Similarly, in mode 6, the negative-R assist circuit is disabled due to the lower data rate (sampling frequency ⅛ of the mode 1 sampling frequency). In order to limit the scaling of the capacitors C1 and C2, resistance values of loop filter resistors Ri, Rdac1, and R2 are doubled. That allows scaling of C1 and C2 to be limited to 4× to keep the NTF thermal noise floor constant. Given the smaller bandwidth (¹⁄₁₆), R1 is scaled up by 8× (4× more than the rest of the loop filter resistors) to more closely match the NTF zero to the IF of the reduced frequency (zero location scaled down by additional factor of 2).

The various programmable entries shown in Table 1 can be configured by writing the desired control signal values to non-volatile memory (NVM) and supplying the control signals to configure the various settings at power up. Thus, e.g., the NVM stores the switch settings for the negative-R circuit 415, the desired resistances for adjustable resistances Ri, Rdac1, R1, and R2, the desired capacitances for adjustable capacitances C1 and C2, and the desired sampling frequency. The NVM may be written after packaging through a serial interface (not shown in FIG. 4) and before shipping the components to customers or the various circuit configuration may be programmed by customers. In other embodiments, the configuration is pin programmable or determined at power up by writing to the integrated circuit to select a desired configuration.

The loop filter components are configured based on the desired BW. The data rate dictates the BW. For example, a data rate of 1 Mbps implies an approximately 1.5 MHz BW for one specific modulation scheme (e.g., FSK modulation index 0.5). Once the BW requirement is known for given data rate and modulation scheme, the loop filter settings are adjusted to give the most power efficient configuration. Normally high data rate applications use modes mode 1 and 2, for example and very low data rate applications use modes 5 and 6. Note that the loop filter configurations shown in Table 1 are given for a receive chain ADC intended for low-IF application applications in which the IF frequency is set to a relatively low frequency close to DC. In general, however, the ADC shown in FIG. 4 can also be used for zero-IF receivers where the desired signal is placed around DC (i.e., IF=0).

Figure 8:
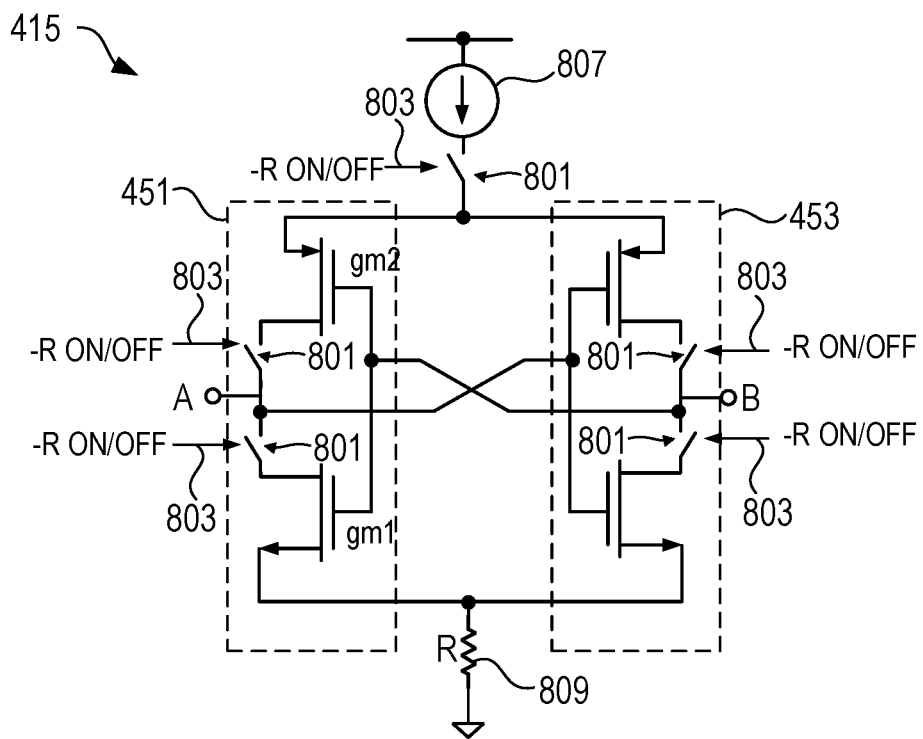
FIG. 8 illustrates additional detail of the negative-R assist circuit and, in particular, the switches associated with enabling and disabling the circuit.

FIG. 8 illustrates additional details of the negative-R assist circuit 415. In the embodiment of FIGS. 4 and 8 the negative-R assist circuit 415 is implemented as two inverters 451 and 453. The negative-R assist circuit is disabled by opening switches 801 responsive to the control signal 803 being set to −R OFF and the negative-R assist circuit is enabled by closing switches 801 responsive to the control signal 803 being set to −R ON. With the switches closed, the output of the inverter 451 and the input to inverter 453 are coupled to node A and the output of inverter 453 and the input to inverter 451 are coupled to node B and with the switches open the outputs of the inverters are disconnected from nodes A and B. The current source 807 is also connected/disconnected to the inverters based on the −R ON/OFF control signal. Note that additional switches may be used to isolate the transistor inputs from nodes A and B. The resistor R 809 sets the output common level of nodes A and B.

Although the core of the negative-R circuit is implemented with two cross-coupled inverters 451 and 453 with the nodes A and B connected to the differential virtual ground nodes of the amplifier (ixp and ixn of amplifier 401 in FIG. 4) they should be considered as analog CMOS amplifiers with output impedance of −1/(gm1+gm2). Referring to FIG. 5, α=1 implies 1/(gm1+gm2) is set equal to Rin. For the ADC configuration in FIG. 4, α=1 corresponds to 1/(gm1+gm2)=Ri//Rdac1. Note that the value of a can be set to other values (e.g., 0.5) by adjusting the value of the current provided by current source 807 (see FIG. 8). That capability is useful to provide an intermediate value for negative-R between fully ON or OFF intended for, e.g., medium BW settings or process calibration.

Referring back to FIG. 4, the digital to analog converters (DACs) 421, 423, 425, and 427 are implemented as resistive DACs as shown in isolation in FIG. 9. While resistive DACs may be used, in other embodiments, current steering DACs shown in FIG. 10 can be used instead. Note that if the current steering DAC of FIG. 10 is used, Iref is adjusted for the different modes of Table 1 to scale Rdac.

Figures 12A, 12B:
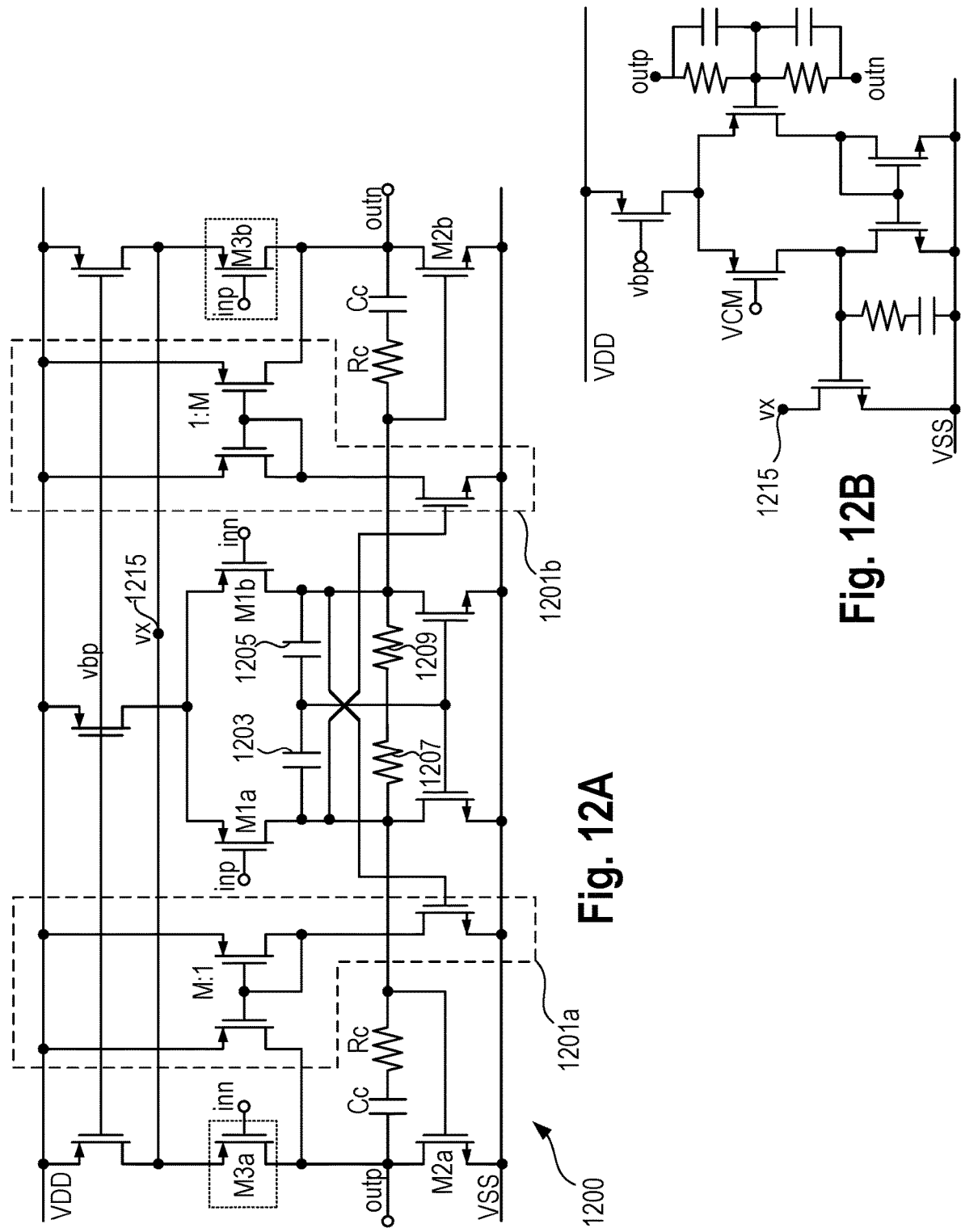
FIG. 12A illustrates a more detailed differential embodiment of a two stage Miller amplifier with an additional feed forward stage and a push-pull output stage.
FIG. 12B illustrates a portion that sets the output common mode voltage of the second stage of the embodiment of a two stage Miller amplifier with an additional feed forward stage and a push-pull output stage.

The embodiment shown in FIG. 4 adopts a single amplifier loop filter topology for lower power consumption and smaller die-area. Referring to FIG. 11, an embodiment of the single amplifier 401 utilizes a two-stage Miller amplifier 1100 with an additional feedforward path. For ease of illustration, the embodiment of FIG. 11 is shown as a single ended amplifier. The amplifier 1100 includes two stages 1101 and 1103 and feedforward stage 1105. FIGS. 12A and 12B illustrate a more detailed differential embodiment of a two stage Miller amplifier with a push-pull output stage for lower power. Transistors M1a and M1b correspond to the first stage 1101 and transistors M2a and M2b correspond to the second stage 1103. The feedback stage transistors include M3a and M3b located between the input inn and the output outp (or inp and outn), where "p" designates the positive input or output and "n" designates the negative input or output. The push pull stages on each side of the differential circuit are stages 1201a and 1201b. The capacitors 1203, 1205 and the resistors 1207 and 1209 set the output common mode voltage of the first stage. FIG. 12B illustrates the circuit for setting the output common mode voltage of the second stage. Note that node Vx 1215 of the circuit portion illustrated in FIG. 12B couples to the circuit portion shown in FIG. 12A at node Vx 1215. In an embodiment the output common mode voltage is lower than the input common mode. The M3 transistors may be implemented as standard voltage threshold (SVT) transistors for increased output swing as compared to low threshold voltage (LVT). Cc and Rc form the Miller compensation network of the two-stage amplifier.

In one or more embodiments, amplifier 401 in the loop filter of the DSM ADC in FIG. 4, uses the current efficient two-stage push-pull amplifier with a feed-forward path illustrated in FIGS. 12A and 12B. For low-bandwidth modes (low data rate) where the sampling frequency is low, the amplifier 1200 has enough loop gain not to degrade performance. At high bandwidth operation, to keep the power low while mitigating the undesirable effects of finite gain of the amplifier used in the loop-filter, the "negative-R" compensation scheme is employed.

Thus, various aspects of a low power second order DSM-based ADC have been described. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method comprising:
configuring an analog to digital converter (ADC) capable of operating at either a first data rate or a second data rate to operate at the second data rate, the second data rate being lower than the first data rate;
configuring the ADC to operate at the second data rate by disabling a negative-R compensation circuit coupled to inputs of an amplifier of a delta sigma modulator in the ADC.

2. The method as recited in claim 1 further comprising:
for operating the ADC at the second data rate with the negative-R compensation circuit disabled, setting an input resistance coupled to a first input of the amplifier to a second resistance value higher than a first resistance value that is used with the negative-R compensation ciecuit enabled and for operating the ADC at the second data rate with the negative-R compensation circuit disabled setting a loop filter capacitance in the delta sigma modulator of the ADC to a second capacitance value higher than a first capacitance value that is used with the negative-R compensation circuit enabled.

3. The method as recited in claim 1 further comprising:
lowering a zero of a noise transfer function associated with the analog to digital converter by increasing a resistance value of resistances of a loop filter of the delta sigma modulator.

4. The method as recited in claim 1, further comprising:
wherein the delta sigma modulator is a second order sigma-delta modulator with a single operational amplifier.

5. The method as recited in claim 4, further comprising:
wherein the single operational amplifier is a two-stage Miller amplifier with a feedforward path and a push-pull stage.

6. The method as recited in claim 1, further comprising configuring the analog to digital converter to operate with a bandwidth in a bandwidth range between a first bandwidth and a second bandwidth that is twice the first bandwidth.

7. The method as recited in claim 1,
wherein the ADC is in a receive path of a radio.

8. An analog to digital converter (ADC) comprising:
a delta sigma modulator; and
a negative-R compensation circuit selectively enabled to provide a loop gain enhancement, when enabled, to an amplifier of the delta sigma modulator and configurable to be enabled for a first data rate for data being supplied to the delta sigma modulator and to be disabled for a second data rate for data being supplied to the delta sigma modulator, the second data rate being lower than the first data rate.

9. The analog to digital converter as recited in claim 8, further comprising:
a first input resistance coupled to a positive input of the amplifier and configurable to be set to a first resistance value while the negative-R compensation circuit is enabled and to be set to a second resistance value while the negative-R compensation circuit is disabled, the second resistance value being higher than the first resistance value.

10. The analog to digital converter as recited in claim 9, further comprising:
a plurality of loop filter resistances set to first respective resistance values with the negative-R compensation circuit enabled and set to second respective resistance values, scaled up from the first respective resistance values, with the negative-R compensation circuit disabled.

11. The analog to digital converter as recited in claim 9 further comprising a loop filter capacitance of the delta sigma modulator configurable to be a first capacitance value with the negative-R compensation circuit enabled and to be a second capacitance value higher than the first capacitance value with the negative-R compensation circuit disabled.

12. The analog to digital converter as recited in claim 8 further comprising:
a loop filter resistance coupled between a negative output of the amplifier and a positive input of the amplifier and configurable to be a first resistance value when a zero of a noise transfer function associated with the analog to digital converter is at a first frequency and the loop filter resistance is configured to be at a second resistance value, higher than the first resistance value, when the zero of the noise transfer function is at a second frequency lower than the first frequency.

13. The analog to digital converter as recited in claim 8, wherein the delta sigma modulator is a second order sigma delta modulator with a single operational amplifier.

14. The analog to digital converter as recited in claim 13 wherein the delta sigma modulator comprises:
the single operational amplifier;
a first capacitance coupled between a negative output terminal of the single operational amplifier and a positive input terminal of the single operational amplifier;
a first resistance coupled in parallel with the first capacitance;
a second capacitance and a second resistance coupled in series between the negative output terminal of the single operational amplifier and a negative input terminal of the single operational amplifier;
a third capacitance coupled between a positive output terminal of the single operational amplifier and the negative input terminal of the single operational amplifier;
a third resistance in parallel with the third capacitance; and
a fourth capacitance and a fourth resistance coupled in series between the positive output terminal of the single operational amplifier and the positive input terminal of the single operational amplifier.

15. The analog to digital converter as recited in claim 13 wherein the single operational amplifier is a two-stage Miller amplifier with a feedforward path and a push-pull stage.

16. The analog to digital converter as recited in claim 13, wherein the analog to digital converter is configurable to operate at a sampling frequency for the delta sigma modulator that ranges between a first sampling clock frequency and a second sampling clock frequency that is eight times the first sampling clock frequency and wherein a bandwidth of the ADC is configurable to be between a first bandwidth and a second bandwidth that is sixteen times the first bandwidth.

17. An analog to digital converter (ADC) comprising:
a delta sigma modulator; and
a negative-R compensation circuit coupled to one or more switches, the one or more switches responsive to a first value of a control signal to enable the negative-R compensation circuit across input terminals of an amplifier of the delta sigma modulator and responsive to a second value of the control signal to disable the negative-R compensation circuit.

18. The ADC as recited in claim 17, wherein a higher ADC sampling clock frequency is used with first bandwidths of the ADC and a lower sampling clock frequency is used with second bandwidths of the ADC and a thermal noise level is kept within approximately 0.2 dB across the ADC configured for operating at the first or second bandwidths and the first bandwidths are higher than the second bandwidths.

19. The analog to digital converter as recited in claim 17, wherein a noise transfer function zero of the delta sigma modulator is programmable.

20. The analog to digital converter as recited in claim 17, wherein,
with the negative-R compensation circuit enabled, a compensation level of the negative-R compensation circuit is set to an intermediate compensation level responsive to a data rate of data being supplied to the delta sigma modulator being at an intermediate data rate between a second data rate at which the negative-R compensation circuit is disabled and a maximum data rate and the compensation level of the negative-R compensation circuit is set to a high compensation level responsive to the data rate being at a high data rate above the intermediate data rate, the high compensation level having a magnitude of a negative resistance value of the negative-R compensation circuit approximately equal to an effective input impedance of the amplifier and the intermediate compensation level has the magnitude of the negative resistance value being above the effective input impedance.

21. The analog to digital converter as recited in claim 20 further comprising:
a current source in the negative-R compensation circuit configurable to provide a first current value for the intermediate compensation level and to provide a second current level for the high compensation level.

* * * * *

UNITED STATES PATENT AND TRADEMARK OFFICE
CERTIFICATE OF CORRECTION

PATENT NO. : 10,931,300 B1
APPLICATION NO. : 16/588113
DATED : February 23, 2021
INVENTOR(S) : Abdulkerim L. Coban and Sanjeev Suresh It is certified that error appears in the above-identified patent and that said Letters Patent is hereby corrected as shown below:

In the Claims

In Claim 1, Line 5, please add --and-- after ";"
In Claim 2, Line 27, please replace "ciecuit" with --circuit--

Signed and Sealed this
Twentieth Day of July, 2021

Drew Hirshfeld
*Performing the Functions and Duties of the*
*Under Secretary of Commerce for Intellectual Property and*
*Director of the United States Patent and Trademark Office*